(12) United States Patent
Kim

(10) Patent No.: US 9,780,146 B2
(45) Date of Patent: Oct. 3, 2017

(54) ELECTRONIC DEVICE

(71) Applicant: SK hynix Inc., Icheon (KR)

(72) Inventor: Kyung-Wan Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 191 days.

(21) Appl. No.: 14/951,372

(22) Filed: Nov. 24, 2015

(65) Prior Publication Data

US 2017/0005138 A1 Jan. 5, 2017

(30) Foreign Application Priority Data

Jun. 30, 2015 (KR) .......................... 10-2015-0092583

(51) Int. Cl.
| | | |
|---|---|---|
| H01L 27/24 | (2006.01) | |
| G06F 3/06 | (2006.01) | |
| G06F 12/0802 | (2016.01) | |
| G06F 13/40 | (2006.01) | |
| G06F 13/16 | (2006.01) | |
| H01L 45/00 | (2006.01) | |
| H01L 43/08 | (2006.01) | |
| H01L 43/02 | (2006.01) | |
| H01L 27/22 | (2006.01) | |
| H01L 27/11507 | (2017.01) | |
| H01L 27/1159 | (2017.01) | |

(52) U.S. Cl.
CPC ........ *H01L 27/2463* (2013.01); *G06F 3/0604* (2013.01); *G06F 3/0656* (2013.01); *G06F 3/0679* (2013.01); *G06F 12/0802* (2013.01); *G06F 13/1673* (2013.01); *G06F 13/4068* (2013.01); *H01L 27/1159* (2013.01); *H01L 27/11507* (2013.01); *H01L 27/222* (2013.01); *H01L 43/02* (2013.01); *H01L 43/08* (2013.01); *H01L 45/06* (2013.01); *H01L 45/08* (2013.01); *H01L 45/1233* (2013.01); *H01L 45/1253* (2013.01); *H01L 45/141* (2013.01); *H01L 45/147* (2013.01); *G06F 2212/222* (2013.01)

(58) Field of Classification Search
CPC ........ H01L 45/04; H01L 45/145; H01L 27/24
See application file for complete search history.

(56) References Cited

U.S. PATENT DOCUMENTS

| | | |
|---|---|---|
| 8,674,332 B2 | 3/2014 | Toh et al. |
| 2014/0264228 A1 | 9/2014 | Toh et al. |
| 2015/0109093 A1* | 4/2015 | Higano .................. H01L 45/08 338/20 |

* cited by examiner

*Primary Examiner* — Quoc Hoang

(57) ABSTRACT

An electronic device includes a semiconductor memory. The semiconductor memory includes a line-type first electrode layer having at least one protrusion and extending in a first direction, and a plurality of memory elements, each memory element including a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively.

20 Claims, 6 Drawing Sheets

ELECTRONIC DEVICE

CROSS-REFERENCE TO RELATED APPLICATIONS

The present application claims priority of Korean Patent Application No. 10-2015-0092583, entitled "ELECTRONIC DEVICE" and filed on Jun. 30, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the integration degree of elements.

In one implementation, there is provided an electronic device including a semiconductor memory. The semiconductor memory may include: a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively.

The first electrode comprises: a line-type body part extending in the first direction; and a plurality of protrusions arranged over the line-type body part so as to be spaced away from each other at predetermined intervals in the first direction. Each of the variable resistance layers of the memory elements that are disposed over the two parallel side surfaces of the protrusion further includes an additional portion extending along a top surface of the line-type body part in the first direction by a predetermined width from a corresponding one of the two parallel side surfaces of the protrusion, the additional portion being in contact with a portion of the top surface of the line-type body part that is at a corresponding one of two sides of the protrusion in the first direction. The electronic device may further comprise a plurality of line-type metal wirings being coupled to the second electrodes of the memory elements, respectively, and extending in a second direction intersecting with the first direction. The electronic device may further comprise a plurality of contact plugs coupling the second electrodes of the memory elements to the metal wirings, respectively. The variable resistance layer has a single-layer or multi-layer structure. The variable resistance layer comprises any of a transition metal oxide, a metal oxide including a perovskite-based material, a phase change material including a chalcogenide-based material, a ferrodielectric material, and a ferromagnetic material. The first and second electrodes comprise any one transition metal or nitride selected from the group consisting of TiN, Pt, W, TaN, Ir, Ni, Cu, Ta, Ti, Hf, Zr, and a combination thereof.

The electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another implementation, there is provided an electronic device including a semiconductor memory. The semiconductor memory may include: a memory cell array including three memory cells that are disposed at a protrusion of an electrode layer extending in a first direction, each of the three memory cells including a first electrode, a second electrode, and a variable resistance layer that is interposed between the first electrode and the second electrode, wherein the first electrodes of the three memory cells are disposed in the protrusion of the electrode layer, the electrode layer further including a body part extending in the first direction, the protrusion protruding from a top surface of the body part in a second direction perpendicular to the first direction, wherein the variable resistance layers of the three memory cells are disposed over a top surface and two parallel side surfaces of the protrusion, respectively, the two parallel side surfaces of the protrusion being arranged in the first direction, and wherein the second electrodes of the three memory cells are disposed over the variable resistance layers of the three memory cells, respectively.

Each of the variable resistance layers of the unit memory elements that are disposed over the two parallel side surfaces of the protrusion further includes an additional portion extending along the top surface of the body part in the first direction by a predetermined width from a corresponding one of the two parallel side surfaces of the protrusion, the additional portion being in contact with a portion of the top surface of the body part that is at a corresponding one of two sides of the protrusion in the first direction. The electronic device may further comprise a plurality of line-type metal wirings being coupled to the second electrodes of the three memory cells, respectively, and extending in a third direction crossing the first direction and perpendicular to the second direction. The electronic device may further comprise a plurality of contact plugs coupling the second electrodes of the three memory cells to the metal wirings, respectively.

In the other implementation, there is provided an electronic device comprising a semiconductor memory including a memory cell array. The memory cell array of the semiconductor memory may include: a plurality of line-type electrode layers extend in a first direction and being spaced apart from each other in a second direction crossing the first direction; a plurality of line-type metal wirings extending in the second direction; and a plurality of memory elements disposed at intersections of the plurality of line-type electrode layers and the plurality of line-type metal wirings, wherein each of the line-type electrode layers includes a single body part extending in the first direction and a plurality of protrusions protruding from a top surface of the single body part in a third direction perpendicular to the first and second directions, the protrusions being spaced apart from each other in the first direction, each of the protrusions having two parallel side surfaces arranged in the first direction and a top surface parallel to the top surface of the single body part, and wherein three memory elements among the memory elements are disposed at each of the protrusions and include variable resistance layers disposed over the top surface and the two parallel side surfaces of said each of the protrusions, respectively.

Each of the variable resistance layers that are disposed over the two parallel side surfaces of the protrusion further includes an additional portion extending along the top surface of the single body part in the first direction by a predetermined width from a corresponding one of the two parallel side surfaces of the protrusion, the additional portion being in contact with a portion of the top surface of the single body part that is at a corresponding one of two sides of the protrusion in the first direction. Each of the three memory elements further includes a second electrode disposed over the variable resistance layer, and wherein the electronic device further comprises a plurality of contact plugs coupling the second electrodes of the three memory elements to corresponding ones of the line-type metal wirings, respectively.

DETAILED DESCRIPTION

Figure 1:
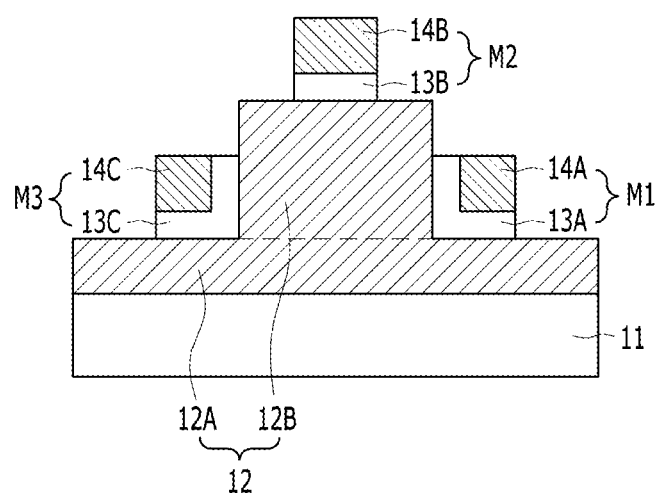
FIG. 1 is a cross-sectional view of a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of a semiconductor device in accordance with an implementation.

As illustrated in FIG. 1, a first electrode layer 12 may be formed over a substrate 11. The first electrode layer 12 may include a line-type body part 12A and a plurality of protrusions 12B. The body part 12A may extend in a first direction that is parallel to a top surface of the substrate 11. The plurality of protrusions 12B may be arranged over the body part 12A so as to be spaced apart from each other at predetermined intervals in the first direction, and protrude in a direction perpendicular to the top surface of the substrate 11. Each of the protrusions 12B may have a top surface that is parallel to and at a different level from a top surface of the body part 12A, and may have two parallel side surfaces arranged in the first direction.

The first electrode layer 12 may serve as an electrode and wiring for applying a voltage or current to a memory element. In the present implementation shown in FIG. 1, the body part 12A and the protrusions 12B of the first electrode layer 12 are distinguished from each other, for convenience of description. In an implementation, the body part 12A and the protrusions 12B may be formed by a process of forming one material layer and selectively etching the material layer. In another implementation, the first electrode layer 12 may be formed by a sequence of processes of forming the line-type body part 12A extending in the first direction and then forming the pillar-type protrusions 12B over the body part 12A.

In the present implementation, the semiconductor device may include a plurality of second electrodes 14B, 14A, and 14C and a plurality of variable resistance layers 13B, 13A, and 13C which are in contact with the top surface and two parallel side surfaces of the protrusion 12B, respectively. Thus, the variable resistance layers 13A and 13C contacting the two parallel side surfaces of the protrusion 12B, respectively, may have an L-shape. Each of the second electrodes 14A, 14B, and 14C and a corresponding one of the variable resistance layers 13A, 13B, and 13C may serve as a memory element.

More specifically, a first memory element M1 may include the L-shaped variable resistance layer 13A and the second electrode 14A. The variable resistance layer 13A may be in contact with a corresponding portion of the first electrode 12 layer, e.g., one of the two parallel side surfaces of the protrusion 12B and a part of the top surface of the body part 12A that is at one of two sides of the protrusion 12B in the first direction. The variable resistance layer 13A may extend along the top surface of the body part 12A in the first direction by a predetermined width from one of the two parallel side surface of the protrusion 12B such that it forms the L-shape. The second electrode 14A may be formed over the variable resistance layer 13A.

The second memory element M2 may include the variable resistance layer 13B and the second electrode 14B. The variable resistance layer 13B may be in contact with the top surface of the protrusion 12B of the first electrode layer 12, and the second electrode 14B may be formed over the variable resistance layer 13B.

The third memory element M3 may include the L-shaped variable resistance layer 13C and the second electrode 14C. The variable resistance layer 13C may be in contact with a corresponding portion of the first electrode layer 12, e.g., the other of the two parallel side surfaces of the protrusion 12B and a part of the top surface of the body part 12A that is at the other of the two sides of the protrusion 12B in the first direction. The variable resistance layer 13C may extend along the top surface of the body part 12A in the first direction by the predetermined width from the other of the two parallel side surfaces of the protrusion 12B such that it forms the L-shape. The second electrode 14C may be formed over the variable resistance layer 13C.

The first, second, and third memory elements M1, M2, and M3 are separate from each other. That is, the variable resistance layers 13A, 13B, and 13C are not in contact with each other, and the second electrodes 14A, 14B, and 14C are not in contact with each other.

In the present implementation, since the first electrode layer 12 includes the protrusion 12B and the memory elements M1, M2, and M3 are formed so as to be in contact with the respective surfaces of the protrusion 12B, a degree of integration of the semiconductor device may be increased compared to a typical cross-point structure including only line-type wirings.

In an implementation, a memory cell may store data using a variable resistance characteristic of switching between different resistance states according to a voltage or current applied thereto. The unit memory cell may include a first electrode, e.g., a portion of the first electrode layer 12, and a second electrode, e.g., 14A, 14B, or 14C, in order to apply a voltage or current, and may further include a variable resistance layer, e.g., 13A, 13B, or 13C, interposed between the first electrode and the second electrode. Thus, as shown in FIG. 1, three unit memory cells share a single first electrode layer.

The variable resistance layers 13A, 13B, and 13C may be formed of a material that switches between different resistance states according to a voltage or current applied thereto. The variable resistance layers 13A, 13B, and 13C may include any of various materials used for RRAM, PRAM, FRAM, MRAM and the like. The various materials may include a transition metal nitride, a transition metal oxide, a metal oxide such as a perovskite-based material, a phase change material such as a chalcogenide-based material, a ferrodielectric material, and a ferromagnetic material. The transition metal oxide may include any one selected from the group consisting of $TaO_x$, $HfO_x$, $WO_x$, $SiO_x$, $TiO_x$, $ZrO_x$, $NiO_x$, $NbO_x$, $VO_x$, $FeO_x$, $ZnO_x$, $CeO_x$, $CuO_x$, $MnO_x$, and a combination thereof, where x is a natural number. Each of the variable resistance layers 13A, 13B, and 13C may have a single-layer or multi-layer structure.

The first electrode layer 12 and the second electrode 14A, 14B, or 14C may serve to supply a voltage or current to the variable resistance layer 13A, 13B, or 13C, respectively. The first electrode layer 12 and the second electrode 14A, 14B, or 14C may be formed of a conductive layer, for example, a metal, a metal nitride, or polysilicon doped with an impurity, or a combination thereof. The first electrode layer 12 and the second electrode 14A, 14B, or 14C may include any one transition metal or nitride selected from the group consisting of TiN, Pt, W, TaN, Ir, Ni, Cu, Ta, Ti, Hf, Zr, and a combination thereof.

Figure 2:
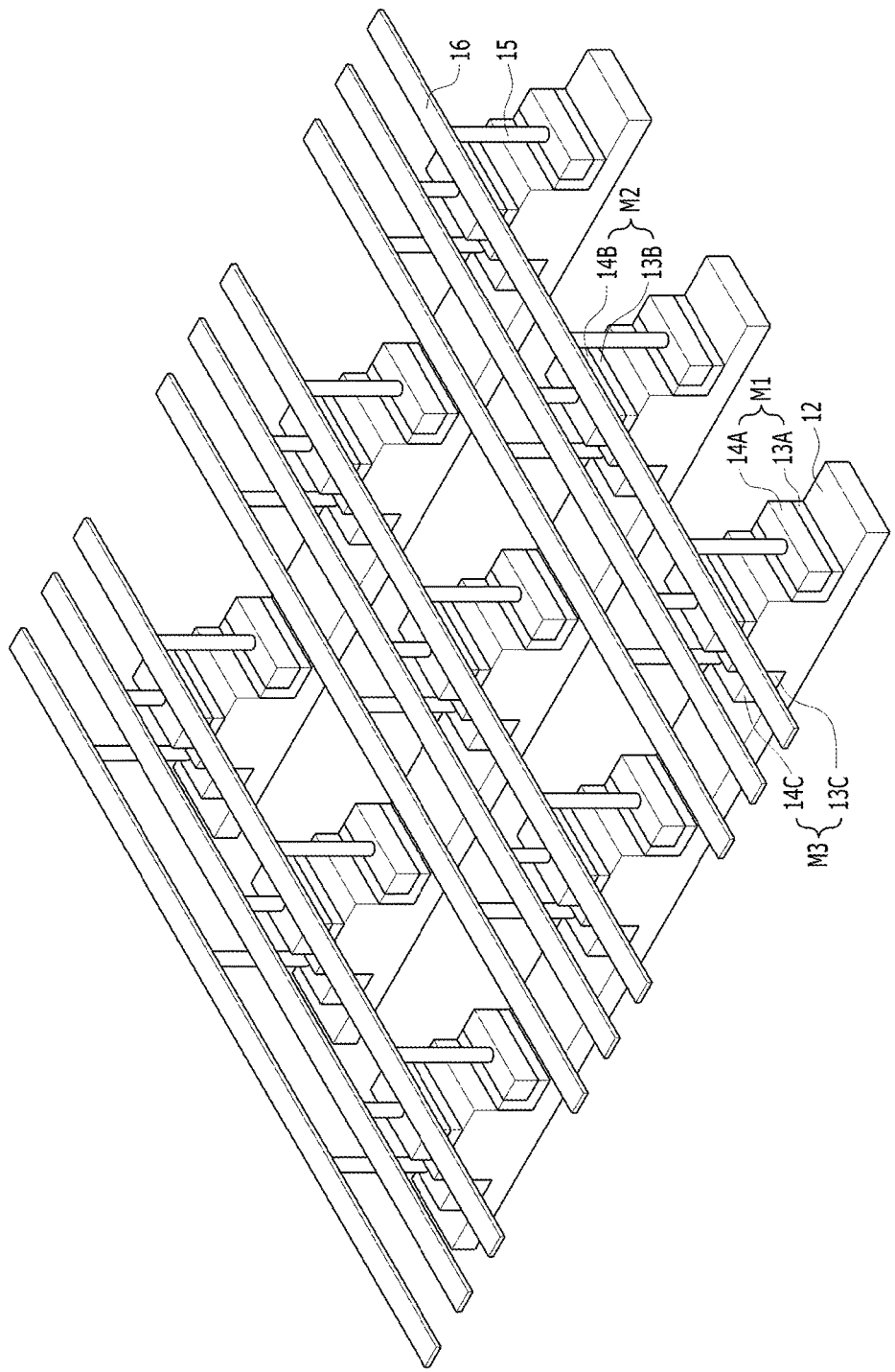
FIG. 2 is a perspective view of a cell array of the semiconductor device of FIG. 1 in accordance with an implementation.

FIG. 2 is a perspective view of a cell array of the semiconductor device of FIG. 1 in accordance with an implementation.

As illustrated in FIG. 2, the cell array may include a plurality of first electrode layers 12, a plurality of metal wirings 16, and a plurality of memory elements M1, M2, and M3. The plurality of first electrode layers 12 may extend in a first direction and be arranged in a second direction crossing the first direction, and each of the first electrode layers 12 may have a plurality of protrusions arranged in the first direction. The plurality of metal wirings 16 may be arranged in the first direction, and be spaced apart from the plurality of first electrode layers 12 in a direction, e.g., a vertical direction, perpendicular to a top surface of the first electrode layer 12, and extend in the second direction to intersect with the plurality of first electrode layers 12. The memory elements M1, M2, and M3 may be disposed at the respective intersections of the plurality of first electrode layers 12 and the plurality of metal wirings 16.

The metal wiring 16 may include any of various conductive materials such as a metal and a metal nitride. In an implementation, the metal wiring 16 may include a low-resistance conductive material. Furthermore, since the respective memory elements M1, M2, and M3 are formed at different levels, the semiconductor device may further include a plurality of contact plugs 15 for coupling the memory elements M1, M2, and M3 to corresponding metal wirings of the plurality of metal wirings 16, respectively. In the present implementation, the memory elements M1, M2, and M3 are coupled to three different metal wirings, respectively.

The memory elements M1, M2, and M3 of FIG. 2 may have substantially the same structure as the memory elements M1, M2, and M3 of FIG. 1, respectively.

An electronic device including the semiconductor device in accordance with the implementation can improve the integration of memory elements.

The above and other memory circuits or semiconductor devices based on the disclosed technology can be used in a range of devices or systems. FIGS. 3-7 provide some examples of devices or systems that can implement the memory circuits disclosed herein.

Figure 3:
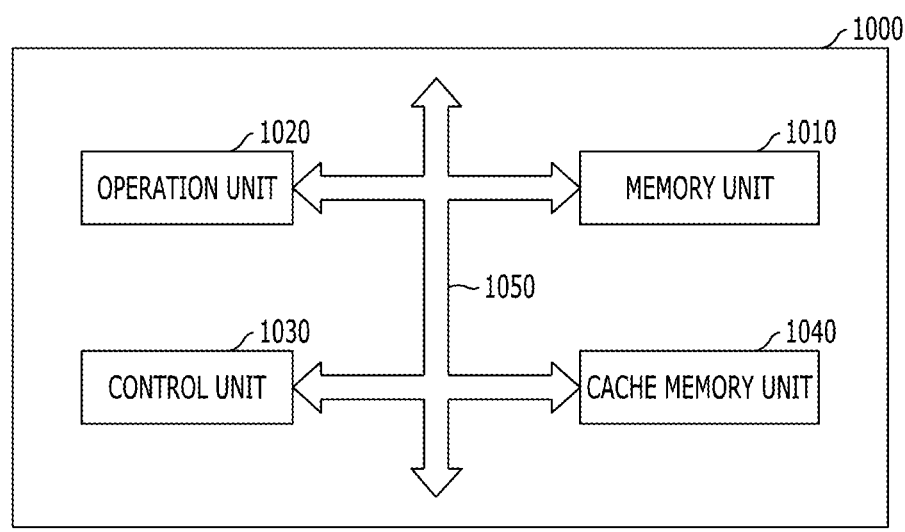
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
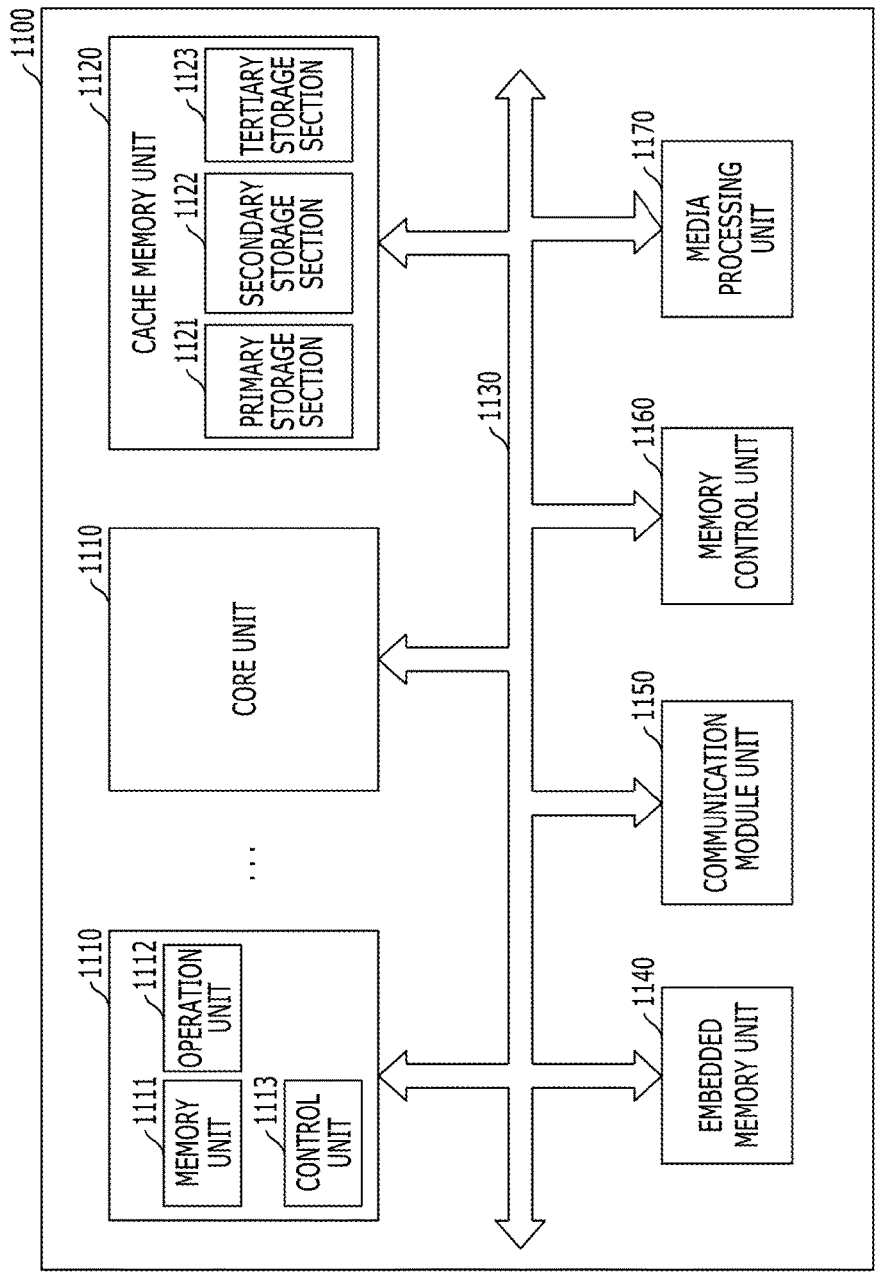
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
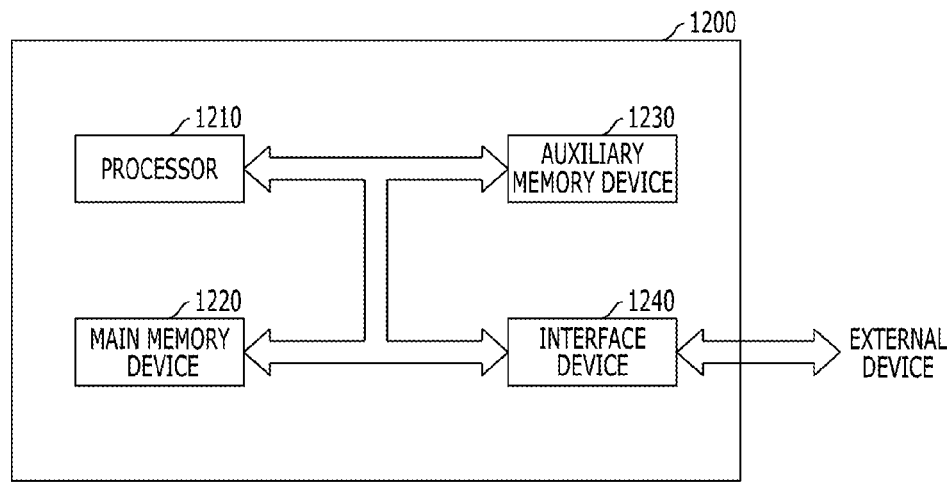
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
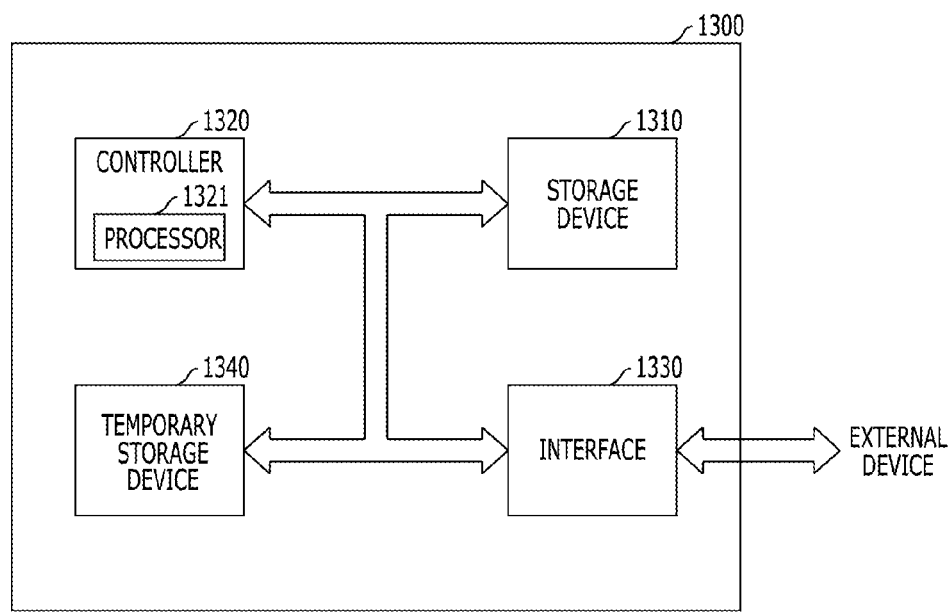
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 7:
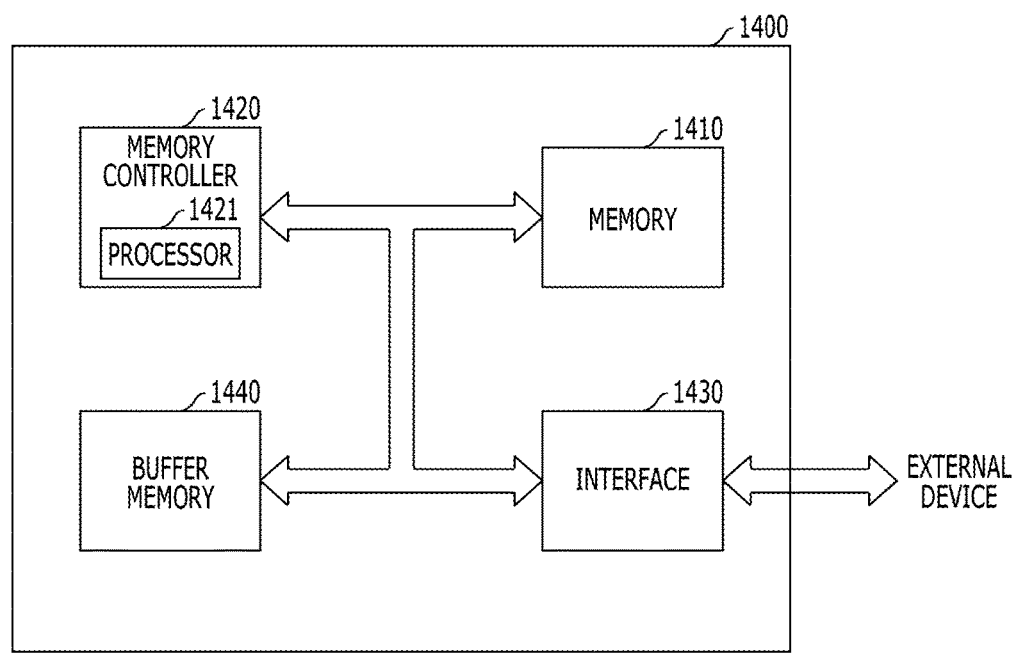
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a line-type first electrode layer having at least one protrusion and extending in a first direction; and a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, the semiconductor memory comprising:
   a line-type first electrode layer having at least one protrusion and extending in a first direction; and
   a plurality of memory elements, each memory element comprising a variable resistance layer and a second electrode, the variable resistance layers of the memory elements being disposed over a top surface and two parallel side surfaces of the protrusion, respectively, the two parallel side surfaces of the protrusion being arranged in the first direction, the second electrodes of the memory elements being disposed over the variable resistance layers of the memory elements, respectively.

2. The electronic device of claim 1, wherein the first electrode comprises:
   a line-type body part extending in the first direction; and
   a plurality of protrusions arranged over the line-type body part so as to be spaced away from each other at predetermined intervals in the first direction.

3. The electronic device of claim 2, wherein each of the variable resistance layers of the memory elements that are disposed over the two parallel side surfaces of the protrusion further includes an additional portion extending along a top surface of the line-type body part in the first direction by a predetermined width from a corresponding one of the two parallel side surfaces of the protrusion, the additional portion being in contact with a portion of the top surface of the line-type body part that is at a corresponding one of two sides of the protrusion in the first direction.

4. The electronic device of claim 1, further comprising a plurality of line-type metal wirings being coupled to the second electrodes of the memory elements, respectively, and extending in a second direction intersecting with the first direction.

5. The electronic device of claim 4, further comprising a plurality of contact plugs coupling the second electrodes of the memory elements to the metal wirings, respectively.

6. The electronic device of claim 1, wherein the variable resistance layer has a single-layer or multi-layer structure.

7. The electronic device of claim 1, wherein the variable resistance layer comprises any of a transition metal oxide, a metal oxide including a perovskite-based material, a phase change material including a chalcogenide-based material, a ferrodielectric material, and a ferromagnetic material.

8. The electronic device of claim 1, wherein the first and second electrodes comprise any one transition metal or nitride selected from the group consisting of TiN, Pt, W, TaN, Ir, Ni, Cu, Ta, Ti, Hf, Zr, and a combination thereof.

9. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the resistance variable element is part of the memory unit in the microprocessor.

10. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

11. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit that includes the resistance variable element is part of the auxiliary memory device or the main memory device in the processing system.

12. The electronic device according to claim 1, further comprising a data storage system which includes:
a storage device configured to store data and conserve stored data regardless of power supply;
a controller configured to control input and output of data to and from the storage device according to a command inputted from the outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

13. The electronic device according to claim 1, further comprising a memory system which includes:
a memory configured to store data and conserve stored data regardless of power supply;
a memory controller configured to control input and output of data to and from the memory according to a command inputted from the outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

14. An electronic device comprising a semiconductor memory, the semiconductor memory comprising:
a memory cell array including three memory cells that are disposed at a protrusion of an electrode layer extending in a first direction, each of the three memory cells including a first electrode, a second electrode, and a variable resistance layer that is interposed between the first electrode and the second electrode,
wherein the first electrodes of the three memory cells are disposed in the protrusion of the electrode layer, the electrode layer further including a body part extending in the first direction, the protrusion protruding from a top surface of the body part in a second direction perpendicular to the first direction,
wherein the variable resistance layers of the three memory cells are disposed over a top surface and two parallel side surfaces of the protrusion, respectively, the two parallel side surfaces of the protrusion being arranged in the first direction, and wherein the second electrodes of the three memory cells are disposed over the variable resistance layers of the three memory cells, respectively.

15. The electronic device of claim 14, wherein each of the variable resistance layers of the unit memory elements that are disposed over the two parallel side surfaces of the protrusion further includes an additional portion extending along the top surface of the body part in the first direction by a predetermined width from a corresponding one of the two parallel side surfaces of the protrusion, the additional portion being in contact with a portion of the top surface of the body part that is at a corresponding one of two sides of the protrusion in the first direction.

16. The electronic device of claim 14, further comprising a plurality of line-type metal wirings being coupled to the second electrodes of the three memory cells, respectively, and extending in a third direction crossing the first direction and perpendicular to the second direction.

17. The electronic device of claim 16, further comprising a plurality of contact plugs coupling the second electrodes of the three memory cells to the metal wirings, respectively.

18. An electronic device comprising a semiconductor memory including a memory cell array, wherein the memory cell array of the semiconductor memory comprises:
- a plurality of line-type electrode layers extend in a first direction and being spaced apart from each other in a second direction crossing the first direction;
- a plurality of line-type metal wirings extending in the second direction; and
- a plurality of memory elements disposed at intersections of the plurality of line-type electrode layers and the plurality of line-type metal wirings, wherein each of the line-type electrode layers includes a single body part extending in the first direction and a plurality of protrusions protruding from a top surface of the single body part in a third direction perpendicular to the first and second directions, the protrusions being spaced apart from each other in the first direction, each of the protrusions having two parallel side surfaces arranged in the first direction and a top surface parallel to the top surface of the single body part, and wherein three memory elements among the memory elements are disposed at each of the protrusions and include variable resistance layers disposed over the top surface and the two parallel side surfaces of said each of the protrusions, respectively.

19. The electronic device of claim 18, wherein each of the variable resistance layers that are disposed over the two parallel side surfaces of the protrusion further includes an additional portion extending along the top surface of the single body part in the first direction by a predetermined width from a corresponding one of the two parallel side surfaces of the protrusion, the additional portion being in contact with a portion of the top surface of the single body part that is at a corresponding one of two sides of the protrusion in the first direction.

20. The electronic device of claim 18, wherein each of the three memory elements further includes a second electrode disposed over the variable resistance layer, and
wherein the electronic device further comprises a plurality of contact plugs coupling the second electrodes of the three memory elements to corresponding ones of the line-type metal wirings, respectively.

* * * * *